United States Patent
Drazynski et al.

(10) Patent No.: US 10,194,358 B2
(45) Date of Patent: Jan. 29, 2019

(54) ESTABLISHING AND MAINTENANCE OF A NEIGHBOUR RELATIONSHIP BETWEEN ACCESS NODES IN A WIRELESS COMMUNICATIONS NETWORK

(71) Applicant: Nokia Solutions and Networks Oy, Espoo (FI)

(72) Inventors: Karol Drazynski, Wroclaw (PL); Maciej Pakulski, Czernica (PL); Markus Wimmer, Blaustein (DE); Hanns Juergen Schwarzbauer, Grobenzell (DE)

(73) Assignee: Nokia Solutions and Networks Oy, Espoo (FI)

( * ) Notice: Subject to any disclaimer, the term of this patent is extended or adjusted under 35 U.S.C. 154(b) by 0 days.

(21) Appl. No.: 15/236,901

(22) Filed: Aug. 15, 2016

(65) Prior Publication Data

US 2016/0366624 A1 Dec. 15, 2016

Related U.S. Application Data (63) Continuation of application No. 13/877,012, filed as application No. PCT/EP2011/066737 on Sep. 27, 2011, now abandoned.

(30) Foreign Application Priority Data

Oct. 1, 2010 (WO) .................. PCT/EP2010/064660

(51) Int. Cl.
*H04W 36/00* (2009.01)
*H04W 24/10* (2009.01)
(Continued)

(52) U.S. Cl.
CPC ....... *H04W 36/0083* (2013.01); *H01L 31/182* (2013.01); *H01L 31/1868* (2013.01);
(Continued)

(58) Field of Classification Search
CPC . H04W 36/0061; H04W 48/16; H04W 24/10; H04W 88/08; H04W 84/045;
(Continued)

(56) References Cited

U.S. PATENT DOCUMENTS

| 8,441,997 B2 * | 5/2013 | Yun ........................ H04W 24/00 370/329 |
| 9,313,670 B2 * | 4/2016 | Martin .............. H04W 36/0083 |

(Continued)

FOREIGN PATENT DOCUMENTS

| WO | WO 2009/019319 A2 | 2/2009 |
| WO | WO 2011/163403 A2 | 12/2011 |

OTHER PUBLICATIONS

3GPP TSG RN#60, Jeju, South Korea, Nov. 5-9, 2007, R2-074907, "Inter-RAT/frequency Automatic Neighbor Relation Function", 6 pgs.

(Continued)

*Primary Examiner* — Nam T Huynh
(74) *Attorney, Agent, or Firm* — Harrington & Smith (57) ABSTRACT

A method of establishing a relationship between access nodes in a wireless communications network is provided. An access node is registered with the network. Information about each access node registered with the network is then stored at a control node. A list is then compiled at the control node, which includes each access node registered with the network and the list indicates which access node is a neighbor of another access node. This neighbor list is sent from the control node to each access node in the network. When an access node detects other access nodes, this is reported to the control node, which updates the neighbor list to the access nodes.

6 Claims, 11 Drawing Sheets

(51) Int. Cl.
*H04W 24/02* (2009.01)
*H04W 84/04* (2009.01)
*H01L 31/18* (2006.01)

(52) U.S. Cl.
CPC ........... *H04W 24/02* (2013.01); *H04W 24/10* (2013.01); *H04W 36/0061* (2013.01); *H04W 84/045* (2013.01); *Y02E 10/546* (2013.01); *Y02P 70/521* (2015.11)

(58) Field of Classification Search
CPC . H04W 36/0083; H04W 48/20; H04W 84/12; H04W 36/0016; H04W 16/32; H04W 24/02; H04W 16/18
See application file for complete search history.

(56) References Cited

U.S. PATENT DOCUMENTS

| | | | |
|---|---|---|---|
| 2009/0052350 A1 | 2/2009 | Chen et al. | 370/255 |
| 2011/0019582 A1 | 1/2011 | Okmyanskiy | 370/254 |
| 2011/0045823 A1 | 2/2011 | Wang | 455/424 |
| 2011/0243097 A1 | 10/2011 | Lindqvist | 370/331 |

OTHER PUBLICATIONS

3GPP TS 25.467 V9.2.0 (Mar. 2010), "3$^{rd}$ Generation Partnership Project; Technical specification Group radio Access Network; UTRAN architecture for 3G Home Node B (HNB); Stage 2 (Release 9)", 34 pgs.

3GPP TS 25.469 V9.0.0 (Dec. 2009), 3$^{rd}$ Generation Partnership Project; Technical Specification Group Radio Access network; UTRAN Iuh interface Home Node B Application Part (HNBAP) signaling (Release 9), 60 pgs.

3GPP TS 36.300 V10.1.0 (Sep. 2010), 3$^{rd}$ Generation Partnership Project; Technical Specification Group Radio Access Network; Evolved Universal Terrestrial Radio Access (E-UTRA) and Evolved Universal Terrestrial Radio Access Network (E-UTRAN); Overall description; Stage 2 (Release 10):, 192 pgs.

* cited by examiner

| Floor „1" room „1"  H(e)NB „1" | Floor „1" room „2"  H(e)NB „2" | Floor „1" room „3"  H(e)NB „3" | Floor „1" room „4"  H(e)NB „4" | Floor „1" room „5"  H(e)NB „5" |
|---|---|---|---|---|
| | | corridor | | |
| Floor „1" room „6"  H(e)NB „6" | Floor „1" room „7"  H(e)NB „7" | Floor „1" room „8"  H(e)NB „8" | Floor „1" room „9"  H(e)NB „9" | Floor „1" room „10"  H(e)NB „10" |

Macro "A"

FIG. 1

H(e)NB „1"  Macro „A"  Macro „B"
            H(e)NB „2"  H(e)NB „7"  H(e)NB „6"

H(e)NB „2"  Macro „A"  Macro „B"
            H(e)NB „1"  H(e)NB „6"  H(e)NB „7"  H(e)NB „8"  H(e)NB „3"

H(e)NB „10"  Macro „B"
             H(e)NB „9"  H(e)NB „4"  H(e)NB „5"

| HNB-ID | cell ID | 0 | 1 | 2 | 3 | 4 | 5 | n |
|---|---|---|---|---|---|---|---|---|
| A | 0 | ■ | ☑ | ☑ | ☑ | | | ☑ |
| B | 1 | | ■ | | | | | |
| C | 2 | ☑ | | ■ | | ☑ | ☑ | ☑ |
| D | 3 | ☑ | | ☑ | ■ | | ☑ | |
| E | 4 | | | | | ■ | | |
| F | 5 | | | | | | ■ | |
| Z | n | | | | | | | ■ | scan reports about cells contained / reporting HNB-ID

ESTABLISHING AND MAINTENANCE OF A NEIGHBOUR RELATIONSHIP BETWEEN ACCESS NODES IN A WIRELESS COMMUNICATIONS NETWORK

CROSS-REFERENCE TO RELATED APPLICATIONS

This application is a continuation of U.S. patent application Ser. No. 13/877,012, which is the National Stage of International Application No. PCT/EP2011/066737, filed Sep. 27, 2011.

FIELD OF THE INVENTION

The invention generally relates to a method of establishing a relationship between access nodes in a wireless communications network. More particularly, the invention relates to establishing and maintaining neighbour relations in a wireless communications network.

BACKGROUND OF THE INVENTION

Within 3GPP, in UTRAN or LTE macro wireless networks (radio access networks or RANs), a femtocell or Home Node B (HNB in a 3G network or H(e)NB in an LTE network) may perform the function of a Node B as an access node to the network but is optimized for use in a home or office (enterprise). Individual access points (HNBs or H(e)NBs are installed individually by end users, without strict supervision of the Mobile Network Operator (MNO).

In any wireless communications network, maintaining an up-to-date neighbor cell relationship is a difficult task for network operators, which requires detailed planning and exact implementation according to the plan. If there is any ambiguity or outdated information about neighbour cell relationships, a problem arises in that the erroneous information may be used in the access nodes of the network. This in turn can lead to inaccurate information being provided to mobile terminals subscribed to the network, for example causing handover from one access node to another to fail. The neighbour cell relationship between access nodes needs to be provisioned at start-up to each access node and kept up to date so as to reflect the actual situation in the network. However, even when the network has been planned in detail and implemented exactly, errors during installation may still occur. The configuration, planning and installation effort of a wireless network should be reduced to a minimum in order to save time and money.

In the cases where a Home Node B network is involved, maintenance of an up-to-date neighbour cell relationship is further complicated by the fact that for a HNB, the node can be switched off and on by the user and therefore availability of related cell is not guaranteed. The basic principle behind uncoordinated deployment of H(e)NBs is that the H(e)NBs, while being part of the MNO's network are installed at the customers' premises in such a way that their deployment does not involve any kind of detailed network planning. Therefore the exact network topology is not known to the operator. This makes it difficult for the operator to become aware of neighbour relationships between the individual access nodes and in turn causes problems in creating cell reselection and handover procedures.

Since the network does not know the exact whereabouts of the H(e)NB, it cannot set up the neighbour list for each of the H(e)NBs; i.e., the list of potential targets for cell reselection (in idle mode) and for handover (in dedicated mode). The knowledge of the actual neighbour nodes of each individual H(e)NB is however necessary, as the mobile subscriber stations or user equipments (UEs) which are camping on a particular cell (in the case of 3G networks) have to be explicitly provided with a list of neighbouring access nodes whose signals these UEs have to measure and take into account in cell reselection procedures. This is also the case in the connected mode, where the UEs are provided with the list of neighbours to measure and report.

In coordinated deployments of macro networks, neighbour relationships between access nodes ((e)Node Bs) are determined using network planning and field measurements, since the MNO is fully aware of the physical location of each access node and can determine the exact neighbours of each access node. This information is then used to create a neighbour list (for 3G networks) or a neighbour relation table (For LTE ANR usage) for each access node in the network. Whenever a new node is added, the MNO can assess its impact on the existing network and possibly update the neighbour lists in the affected nodes.

In uncoordinated deployments, existing solutions for establishing neighbour relationships between H(e)NBs are based on the MNO estimating the neighbours of any given access node, which has a very limited degree of accuracy. Each of the users of the mobile network are supposed to provide their home addresses to the MNO when they subscribe to the network and each HNB is expected to provide information about the strongest detected macro node of the macro network it belongs to (in HNBAP HNB REGISTER REQUEST, as defined in 3GPP TS 25.469). These data can be used by the MNO to derive a tentative neighbour list for that node. As the configuration of H(e)NB parameters is performed automatically at the start-up phase, each H(e)NB receives a generic set of parameters from an Auto Configuration Server (ACS) so in theory there will be a general neighbour list valid for a certain area and all H(e)NBs supposedly located in this area will share the same list. However, updating this list is problematic, as the H(e)NB may be required to reboot or at least actively contact the ACS to obtain a new set of parameters including, the NCL.

Another possible solution to populating the neighbour list in UTRAN and LTE networks is to enable Detected Set Reporting (DSR) by the UEs, where the UEs will report unsolicited neighbours that fulfill the reporting criteria. The downside of this is that it takes a long time to detect all possible neighbours. This means that at the initial stage, when the neighbour list is not complete, there could be a large number of handover failures.

Figure 1:
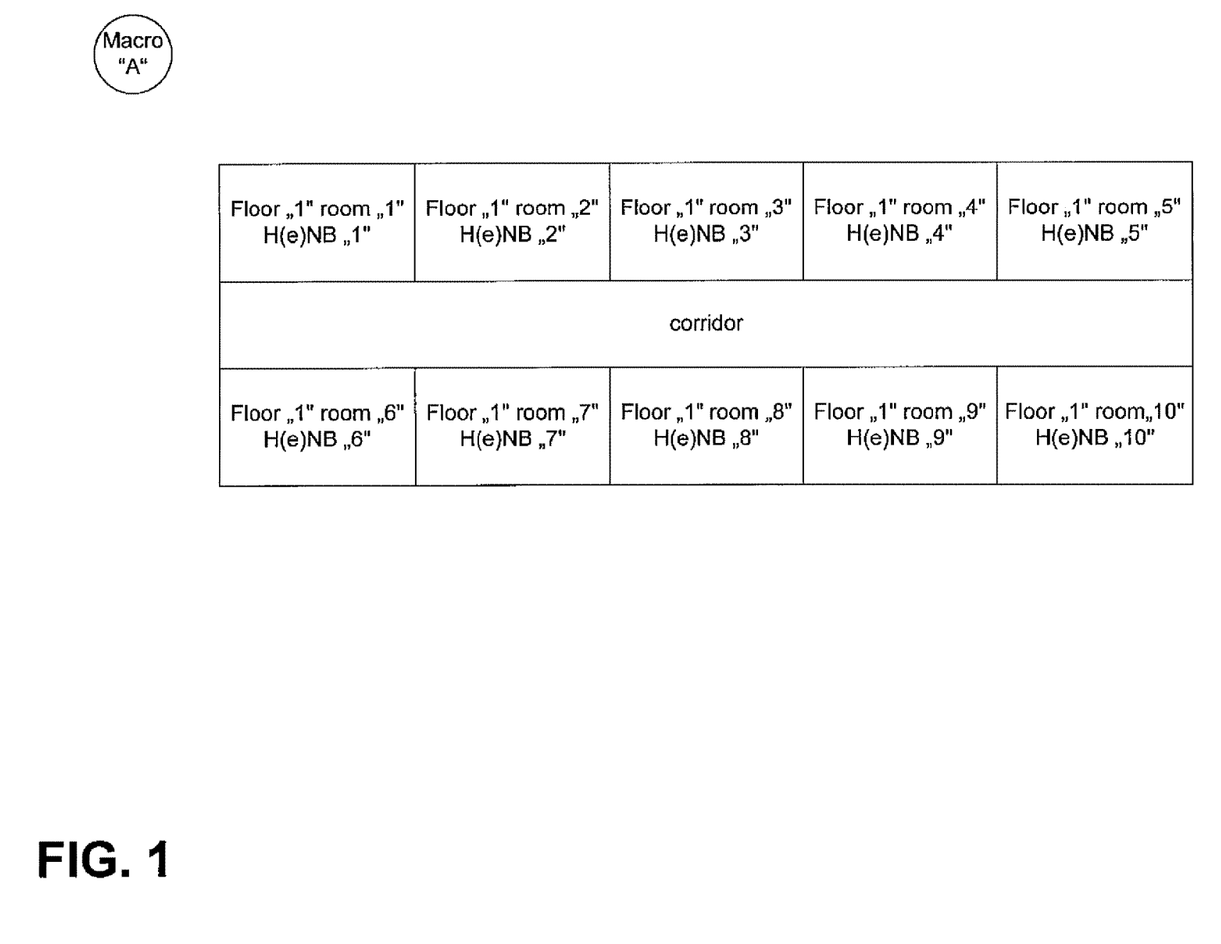
FIG. 1 is a simplified schematic block diagram of an arrangement of H(e)NBs used as access nodes for a wireless communications network in an office (enterprise situation)

The general problem of establishing and maintaining neighbour lists between H(e)NBs is illustrated in FIG. 1, which shows 10 H(e)NBs (H(e)NB 1 . . . 10) installed in 10 rooms (rooms 1 . . . 10), respectively on one floor of an office (enterprise) and able to access two macro networks Macro "A" and Macro "B".

Figure 2:
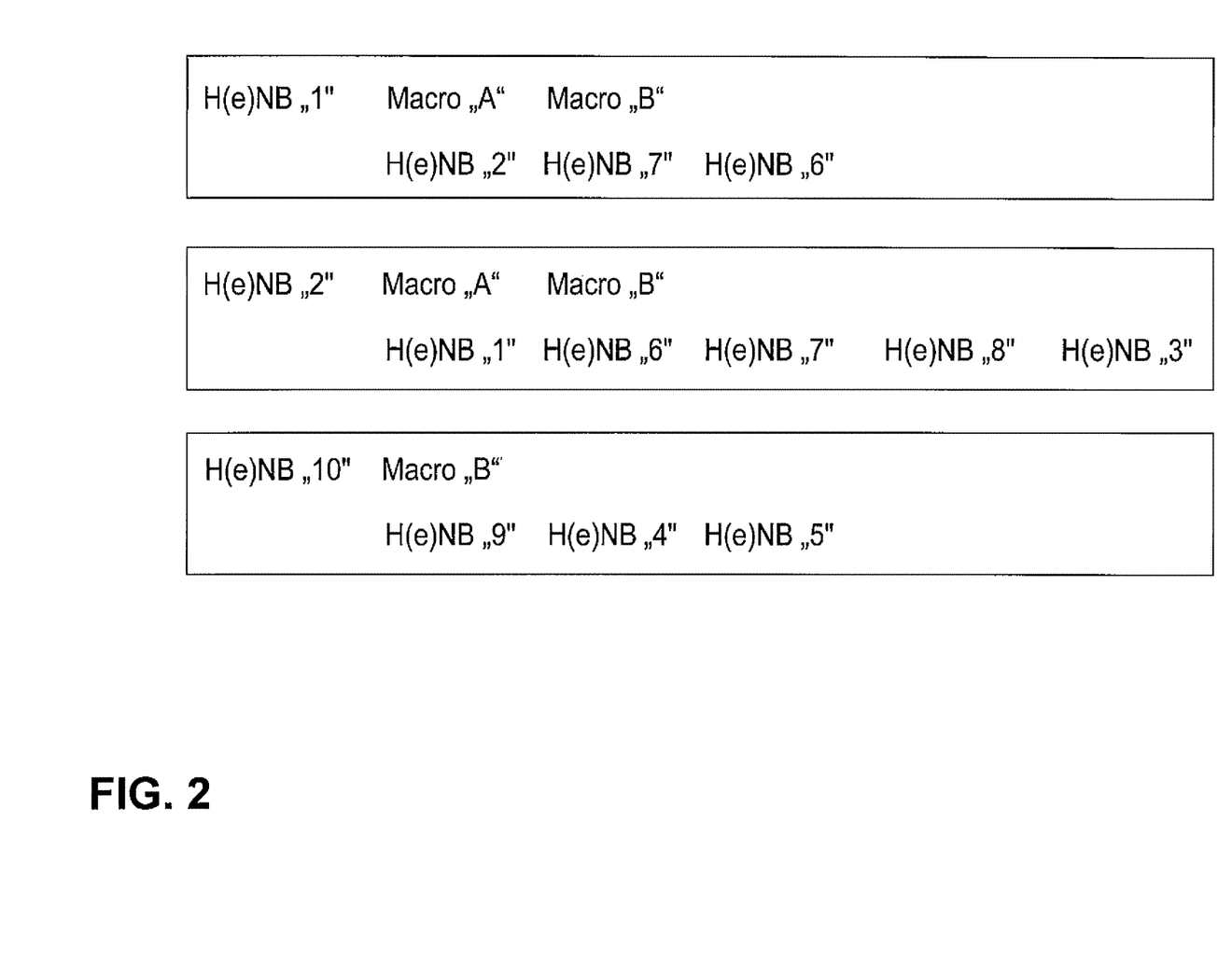
FIG. 2 is an example of a neighbour list of the H(e)NBs shown in FIG. 1 distributed by a management system of the network.

In order to enable the MNO to correctly configure the neighbour lists, the subscriber (in this case the enterprise) not only needs to inform the MNO about which H(e)NB is placed in which room but also about which rooms are the neighbouring rooms, as well as the H(e)NB identities and the position in the room where each H(e)NB is located. Even if there are GPS coordinates available for each of the H(e)NBs 1 . . . 10, the problem remains that the H(e)NBs may not be placed at the locations where they should have been according to planning, for example if two devices become confused with each other. FIG. 2 shows an exemplary neighbour list for three of the H(e)NBs H(e)NB 1, H(e)NB 2 and H(e)NB 10 located in rooms 1, 2 and 10, respectively. Including these H(e)NBs in the neighbour list as distributed by the management system of the network is certainly possible but requires a large effort and very detailed planning. However, these lists can only ever be an estimate and there is no guarantee that they reflect the reality of the situation. For example, if the subscriber had given the MNO wrong information about room location and room 6 was not in fact located opposite to room 1 across the corridor from it but rather on the same side of the corridor next to room 5, the information in the neighbour list of H(e)NBs would be completely wrong.

There is no existing method for a neighbour list of access nodes in a Femto or H(e)NB network to be established and maintained so that the list contains up-to-date information as to which access nodes are neighbours to each other.

It is thus an object of the present invention to overcome the above-mentioned drawbacks and allow neighbour relations to be established and maintained between H(e)NBs so that they are up-to-date, thereby facilitating successful handovers and avoiding failed handover situations.

SUMMARY OF THE INVENTION

Accordingly, in a first aspect, the invention provides a method of establishing a relationship between access nodes in a wireless communications network. The method includes registering an access node with the network, storing at a control node information about each access node registered with the network and compiling a list at the control node including each access node. The list indicates which said access node is a neighbour of another said access node; and sending the neighbour list from the control node to each said access node in the network.

Access nodes via which subscriber stations can access the wireless communications network register with the network and information about the registered access nodes is stored at a control node, for example in a database provided in the control node. Using the information obtained about each access node that registers with the network, the control node can then make a list of all the registered access nodes and indicate on the list which access nodes are neighbours with each other so that the list is a neighbour list or neighbourship relations list.

In this way, actual neighbour cell information is automatically provided to access nodes in the network, instead of merely an estimation, which avoids failed handovers. The initial configuration of a Neighbouring Cell List can be automated. In this way, H(e)NB networks can be configured more easily. Furthermore, the method according to the invention means that the effort involved in network planning for neighbour cells is reduced as the exact location of access points (H(e)NBs) is not required to be known.

The method may also include detecting at the access node other access nodes in the network. The access node can then also report information about itself, as well as about any other access nodes it has detected, to the control node.

In one embodiment, the access node receives the list from the control node. This neighbour list indicates which of the other access nodes detected by the access node its neighbouring access nodes. The neighbour list may then be updated to the access nodes in the network, either by the control node or by the access node itself. In this way, the automated initial configuration of Neighbouring Cell List and all possible updates to the Neighbour Cell List can be provided, which may happen after the start-up of an access node. This means that heterogeneous networks including H(e)NBs as part of a macro cell can be more easily maintained and kept up-to-date.

In a second aspect, the invention provides a method of establishing a relationship between access nodes in a wireless communications network. The method includes detecting at an access node other access nodes in the network, reporting information to a control node about the access node and the detected other access nodes, and receiving a neighbour list from the control node containing a list of access nodes which are neighbouring access nodes.

The step of receiving may further includes receiving an update of the list of access nodes which are neighbouring access nodes.

In an advantageous embodiment, the method further includes sending a request to a subscriber station accessing the network to perform a measurement to detect available cells in the network. The measurement of detected available cells may then be received from the subscriber station and the access nodes of the detected available cells can be compared with the neighbour list received from the control node. Then the detected available cells that do not have access nodes contained in the neighbour list can be reported.

A request or order to the subscriber station to perform the measurement may be triggered if a cell parameter exceeds a predetermined threshold. The subscriber station can then measure n+1 . . . n+k available cells and, if it detects a potential neighbour cell from one of these cells, it can be reported to the control node that the detected cell is a new neighbour cell. This report may take place in a new information element provided in a message sent from the access node to the control node, for example in the HNBAP protocol.

In a third aspect, the invention provides a method of establishing a relationship between access nodes in a wireless communications network. The method includes receiving a command at a subscriber station to perform a measurement of a cell of the network, detecting available cells in the network at the subscriber station, performing the measurement of one of the available cells at the subscriber station. If the measurement is of a cell not contained in a neighbour cell list provided in the access node, then this measurement is reported to an access node of the network.

In a fourth aspect, the invention provides an access node for a wireless communications network. The access node includes a detector configured to detect other access nodes in the network. A transmitter is provided, which is configured to report information about the access node and the detected other access nodes to a control node controlling the access node. A receiver is configured to receive a neighbour list from the control node containing a list of access nodes which are neighbouring access nodes. The receiver is further configured to receive an update of the list of access nodes which are neighbouring access nodes.

The access node may be a home Node B (HNB) as part of a UTRAN network or it may be a home eNode B (HeNB) as part of an LTE network.

Advantageously, the transmitter may be further configured to send a request to a subscriber station accessing the network to perform a measurement to detect available cells in the network. Then the receiver may be further configured to receive the measurement of detected available cells from the subscriber station. In this case, the access node may further include a comparator adapted to compare access nodes of the detected available cells with the neighbour list received from the control node. The access node can be further configured to report the detected available cells that do not have access nodes contained in the neighbour list.

The access node can be triggered to send the request or order to the subscriber station to perform the measurement of n+1 . . . n+k cells in order to find potential neighbour cells (e.g. Detected Set Reporting) if a measurement of a cell parameter exceeds a predetermined threshold.

Once a new neighbour has been found out of the n+1 . . . n+k cells by the subscriber station and reported back to the access node, the access node may then report to the control node (e.g. HNB-GW or HMS) that the detected cell is a new neighbour cell, for example by using a new information element inserted in messages between the access node and the control node. This could simply be achieved by an extension to existing protocols, for example HNBAP.

In a fifth aspect, the invention provides a control node for a wireless communications network, which includes a receiver configured to receive information about access nodes registered with the network and a database configured to store said information about the access nodes. A processor is also provided, which is configured to derive neighbour relationships between the access nodes from said information and to create a neighbour list of the access nodes, as well as a transmitter, which is configured to send the neighbour list to the access nodes.

The control node may be a home (e)Node B gateway (HNB-GW) or a home (e)Node B management system (HMS), for example.

The transmitter of the control node may be further configured to update the neighbour list to the access nodes.

In a sixth aspect, the invention provides a subscriber station for accessing a wireless communications network. The subscriber station includes a receiver configured to receive a command to perform a measurement of a cell of the network and a detector configured to detect available cells. A measurement apparatus, is configured to perform the measurement of one of the available cells and a transmitter is configured to report the measurement to an access node of the network when the measurement is of a cell not contained in a neighbour cell list provided in the access node.

In a seventh aspect, the invention provides a computer program product adapted to run on a processor in a control node of a wireless communications network. The computer program product is adapted to control the control node to perform the steps of registering an access node with the network, storing information in the control node about each said access node registered with the network, and compiling a list at the control node including each said access node, wherein list indicates which access node is a neighbour of another access node, and sending the neighbour list from the control node to each access node in the network.

In an eighth aspect, the invention provides a computer program product adapted to run on a processor in an access node of a communications network, wherein the computer program product is configured to control the access node to perform the steps of detecting at the access node other access nodes in the network, reporting information to a control node about the access node and the detected other access nodes, and receiving a neighbour list from the control node containing a list of access nodes which are neighbouring access nodes.

In a ninth aspect, the invention provides a computer program product adapted to run on a processor in a subscriber station, wherein the computer program product is configured to control the subscriber station to perform the steps of receiving a command to perform a measurement of a cell of the network, detecting available cells in the network, performing a measurement of one of the available cells and reporting the measurement to an access node of the network when the measurement is of a cell not contained in a neighbour cell list provided in the access node.

The invention will now be described, by way of example only, with reference to specific embodiments, and to the accompanying drawings, in which:

DETAILED DESCRIPTION OF EXEMPLARY EMBODIMENTS

Figure 3:
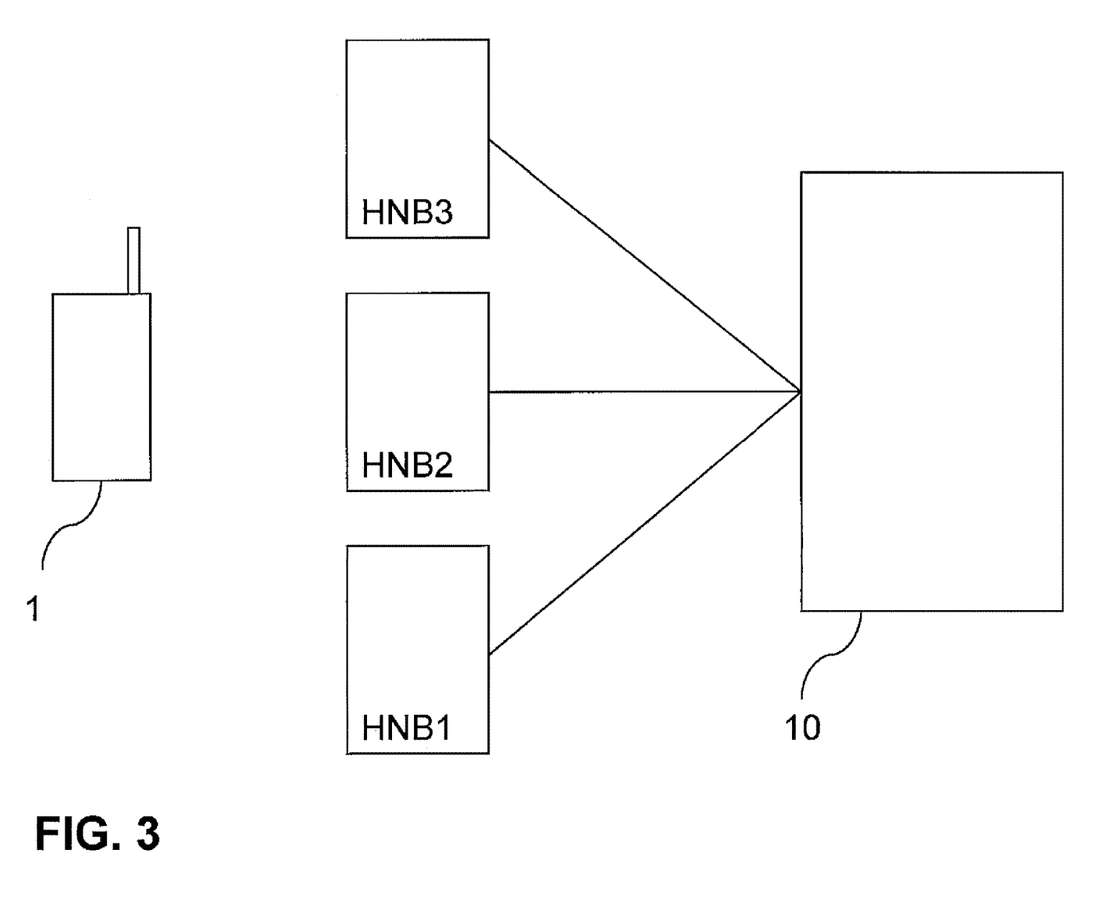
FIG. 3 is a simplified schematic block diagram of a wireless communications network in which a method according to an embodiment of the invention may be implemented.

FIG. 3 shows a wireless communications network having femtocells as part of a macro network run by a mobile network operator (MNO). The femtocells may be part of an enterprise, for example, which subscribes to the macro network and each femtocell has an access point provided by a home node B (HNB) HNB1, HNB2, HNB3. In the following exemplary embodiments, three HNBs are shown although there may be more or fewer in such a network. A mobile subscriber station or user equipment (UE) UE1 may access the network via one of the HNBs HNB1, HNB2, HNB3.

Each of the HNBs are coupled over an interface to a home node B gateway (HNB-GW) 10, which is a control node for controlling the HNBs. The HNBs are also coupled to a Home Node B Management Server (HMS) not shown). Together the HNB-GW and HMS take part in performing operation and maintenance (O&M) functions.

Figure 4:
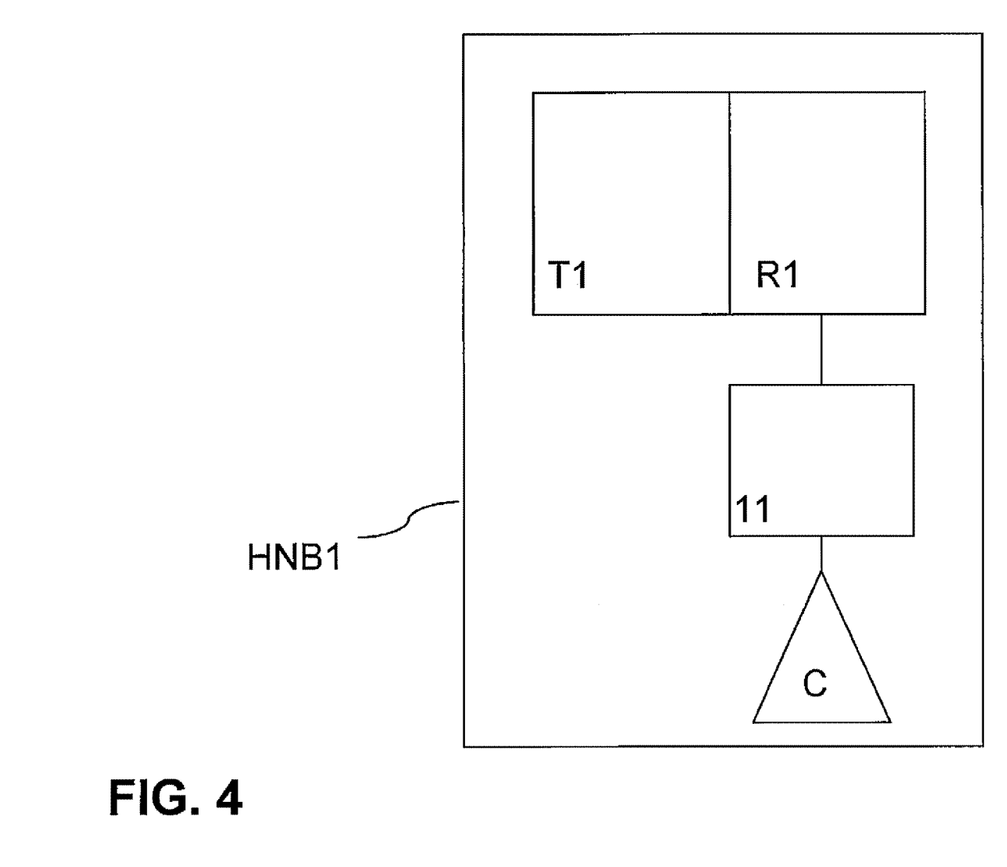
FIG. 4 is a simplified schematic block diagram of an access node according to an embodiment of the invention.
Figure 5:
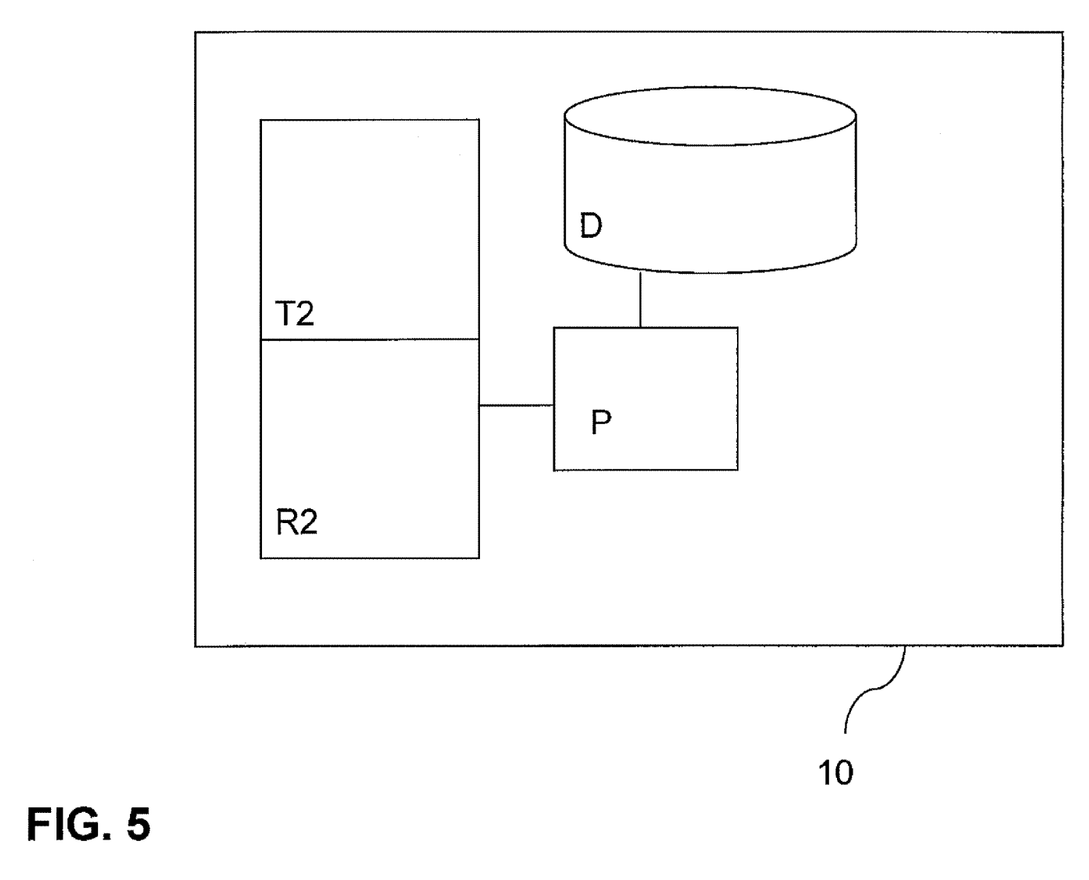
FIG. 5 is a simplified schematic block diagram of a control node according to an embodiment of the invention.
Figure 6:
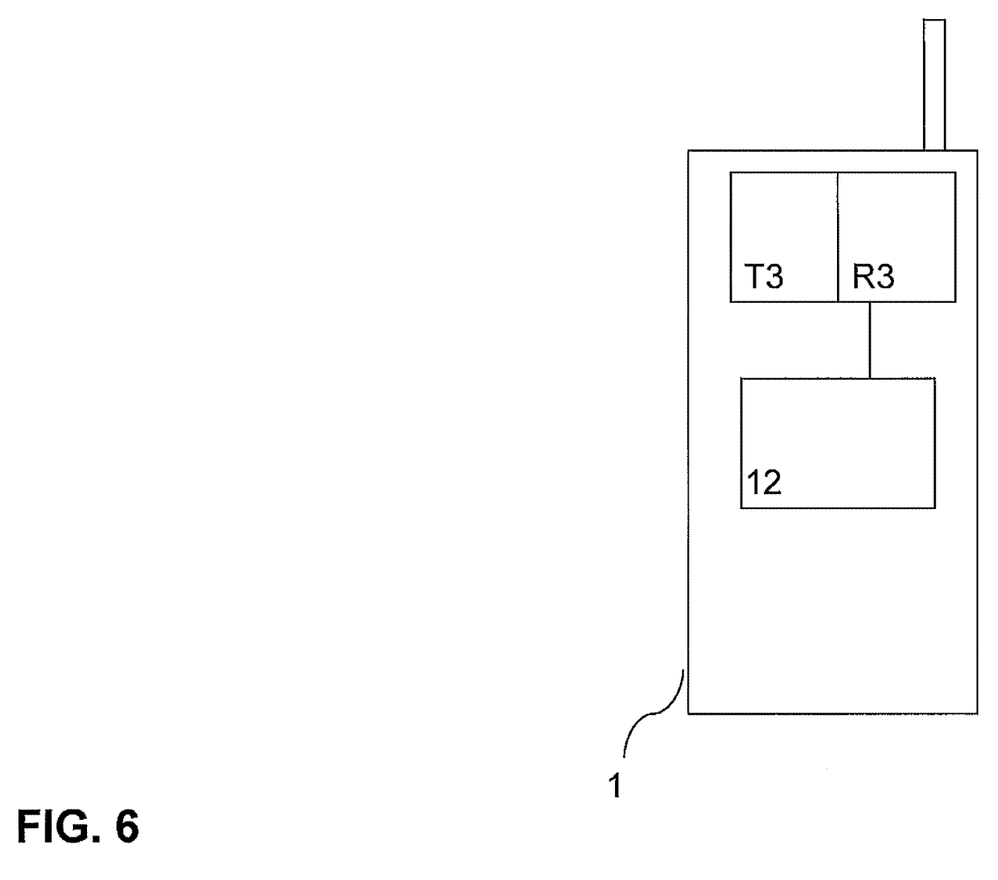
FIG. 6 is a simplified schematic block diagram of a subscriber station according to an embodiment of the invention.

Each HNB HNB1, HNB2, HNB3 has a transmitter T1, a receiver R1, a detector 11 and a comparator C, as shown in FIG. 4. FIG. 5 schematically shows the HNB-GW 10, which has a transmitter T2, a receiver R2 a database D and a processor P; and FIG. 6 schematically shows the UE 1, which has a transmitter T3, a receiver R3, and a detector 12 for detecting and measuring available cells. The HNBs HNB1, HNB2, HNB3, the HNB-GW 10 and the UE1 are all further provided with processors for running software to perform the method according to embodiments of the invention.

During start-up of a HNB (e.g. HNB 1) the device already performs a radio scan, eventually limited by the management system to a limited number of predefined frequencies of frequency ranges. This is done primarily to ensure that HNB HNB 1 is not activating its transmitter T1 while not located in the location initially negotiated between the mobile network operator and the subscriber. For this purpose the management system pre-configures, for example some base stations belonging to the macro network that need to be detected and reported to the HNB-GW 10. However, in a dense HNB deployment situation as for example in an enterprise scenario, the detector 11 in the HNB HNB 1 will also detect nearby HNBs, for example HNB 2 and HNB 3, which may or may not be preconfigured by the management system of the mobile network operator.

Figure 7:
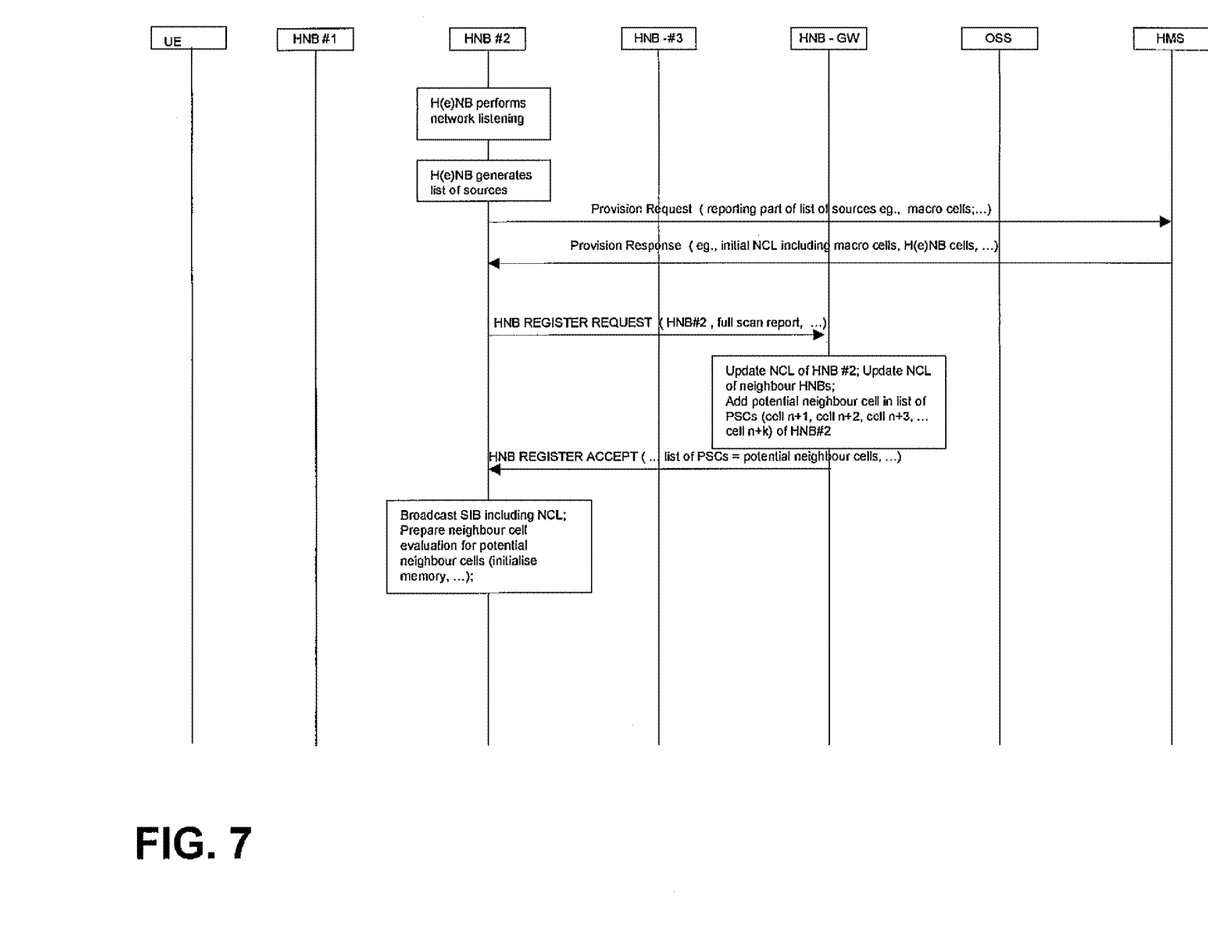
FIG. 7 is an exemplary message flow diagram used in a method according to an embodiment of the invention.

The HNB-GW 10 creates and maintains the database D, which stores H(e)NB identities along with associated information to derive neighbour relations between HNBs HNB1, HNB2, HNB3 served by the HNB-GW 10. The HNB-GW 10 also distributes relevant parts of the list to the HNBs HNB1, HNB2, HNB3 while they are being registered with the network, as well as updating them whenever the neighbour relations change due to newly registered or deregistered HNBs. The HNB-GW 10 collects the data necessary to fill the database D from individual HNB HNBAP REGISTER REQUEST messages, for example. The initial list of relevant neighbours is then provided back to the HNB HNB1, HNB2, HNB3, which it receives at the receiver R1 in HNBAP REGISTER ACCEPT messages, for example. The update of the neighbour list can then be sent to the HNB HNB1, HNB2, HNB3 using a new dedicated HNBAP message, e.g. HNBAP NEIGHBOUR UPDATE message, as illustrated in the message flow diagram in FIG. 7. Additionally the HNB-GW 10 may check and resolve unidirectionality, for example HNB 1 receives the signal from HNB2 but not vice versa.

Each HNB HNB1, HNB2, HNB3 needs to register itself at the HNB-GW 10. During the registration process it provides the HNB-GW 10 with several parameters in a HNBAP REGISTER REQUEST message (see 3GPP TS 25.469) as shown in Table 1.

TABLE 1

HNBAP REGISTER REQUEST message

| PARAMETER | PRESENCE | RANGE | Semantics Description | Criticality | Assigned Criticality |
|---|---|---|---|---|---|
| Message Type | M | | | YES | reject |
| HNB Identity | M | | | YES | reject |
| HNB Location Information | M | | | YES | reject |
| PLMN-ID | M | | | YES | reject |
| Cell-ID | M | | | YES | reject |
| LAC | M | | | YES | reject |
| RAC | M | | | YES | reject |
| SAC | M | | | YES | reject |
| CSG-ID | O | | | YES | reject |
| Service Area For Broadcast | O | | | YES | ignore |
| HNB Cell Access Mode | O | | | YES | reject |

The HNB Location Information IE is sent from the HNB to HNB-GW to provide information on the location of the HNB HNB1, HNB2, HNB 3 and an example of the information that could be provided is illustrated in Table 2.

TABLE 2

HNB Location Information IE

| IE/GROUP NAME | PRESENCE | RANGE | Semantics Description | Criticality | Assigned |
|---|---|---|---|---|---|
| HNB Location Information | | | | — | — |
| > Macro Coverage Information | O | | | — | — |
| > Geographic Location | O | | | — | — |
| > HNB Internet Information | O | | | YES | reject |

The data contained in the location information may either come from the HMS (e.g. geographic location), or be provided by the HNB HNB1, HNB2, HNB 3 itself (e.g. macro coverage, geographic location). These data can then be made available for the HNB-GW 10, so that it can derive potential geographical associations between the HNBs HNB1, HNB2, HNB3 that it controls.

Therefore as soon as a new HNB, e.g. HNB 1 registers itself with the network, its coordinates are added to the database D in the HNB-GW 10, a tentative list of neighbour cells is derived and the list is sent back to the HNB HNB 1 in the HNBAP REGISTER ACCEPT message. The content of the message is shown in Table 3, although it is not limited to that shown in Table 3 and may include additional and/or alternative elements.

TABLE 3

HNBAP REGISTER RESPONSE message

| PARAMETER | PRESENCE | RANGE | Semantics Description | Criticality | Assigned Criticality |
|---|---|---|---|---|---|
| Message Type | M | | | YES | reject |
| RNC-ID | M | | | YES | reject |
| Mux Port Number | O | | The mux port number at which HNB-GW expects to receive multiplexed packets. | YES | Ignore |
| Neighbour Information List | O | 0 to max-noof-Neighbours | | YES | reject |
| PLMN-ID | M | | PLMN ID of HNB neighbour cell | YES | reject |
| Cell-ID | M | | Cell ID of HNB neighbour cell | YES | reject |
| CSG-ID | M | | CSG-ID of each configured neighbour cell | YES | reject |

The list of neighbours contained in the HNBAP REGISTER RESPONSE message represents the state of the network at the moment of the registration of the given HNB. In order to allow for more dynamic behaviour, a new HNBAP message is required. The new message, HNBAP NEIGHBOUR UPDATE, is sent to the relevant HNBs each time the neighbourship relation is modified. The modification occurs when a) new HNB registers at the HNB-GW 10, b) any of the registered HNBs HNB1, HNB2, HNB3 deregister themselves from the HNB-GW 10. At each occurrence of such an event, the HNB-GW 10 reassesses the neighbour relationship table, to determine which HNBs need to be updated about the modification of their neighbours. The new HNBAP message can be an unacknowledged message sent from HNB-GW 10 to an HNB HNB1, HNB2, HNB3, and conveys the following data as shown in Table 4.

TABLE 4

HNBAP NEIGHBOUR UPDATE message

| PARAMETER | PRESENCE | RANGE | Semantics Description | Criticality | Assigned Criticality |
|---|---|---|---|---|---|
| Message Type | M | | | YES | reject |
| Update status | M | Enumerated: [add, remove, update] | Indicates which action HNB has to take | YES | reject |
| PLMN-ID | M | | PLMN ID of HNB neighbour cell | YES | reject |
| Cell-ID | M | | Cell ID of HNB neighbour cell | YES | reject |
| CSG-ID | M | | CSG-ID of neighbour cell | YES | reject |
| PSC | M | | PSC value used by the neighbour cell | YES | reject |

The neighbour list, and the neighbour update message, may also be enhanced with additional information about the neighbours. For example, if an HNB is enabled to establish a direct communication path to another HNB, the information required in support of such feature could also be provided, e.g. Transport Layer Address.

Figure 8:
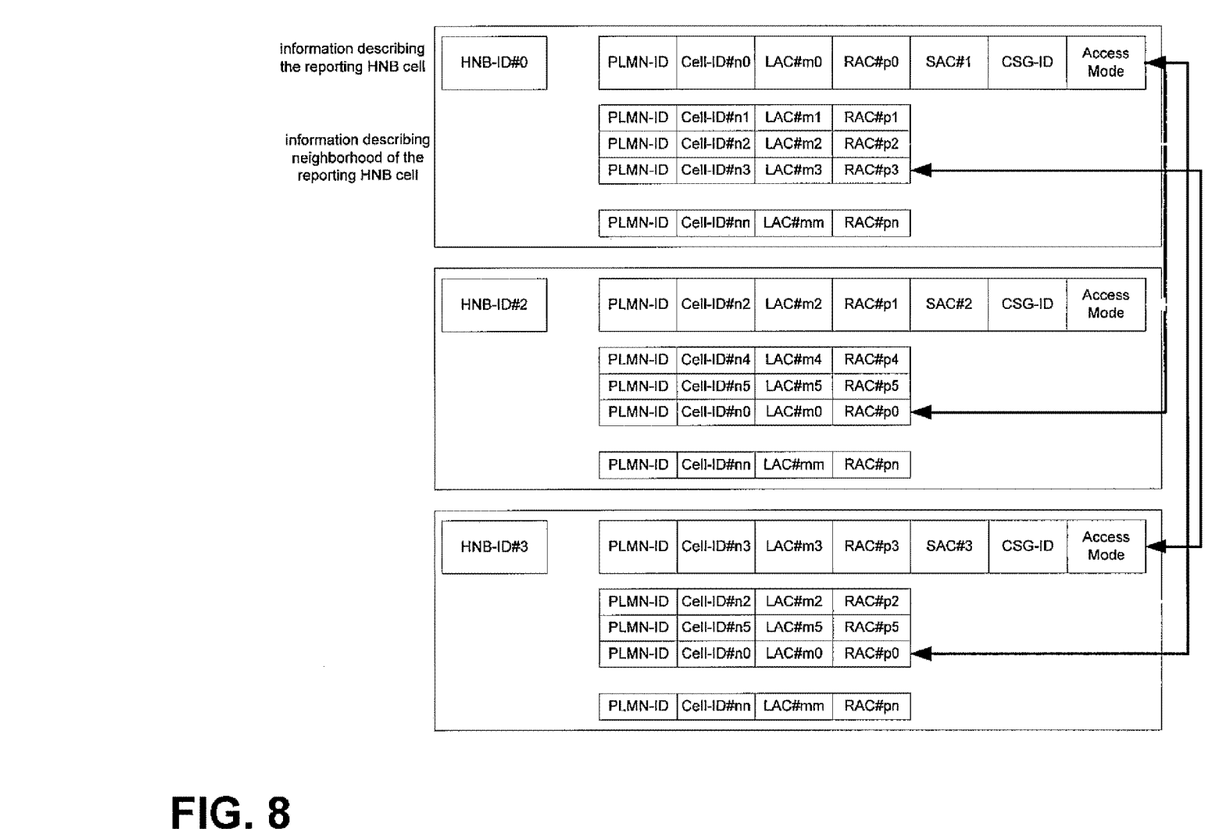
FIG. 8 is a schematic block diagram of information provided to the network by each access node.
Figure 9:
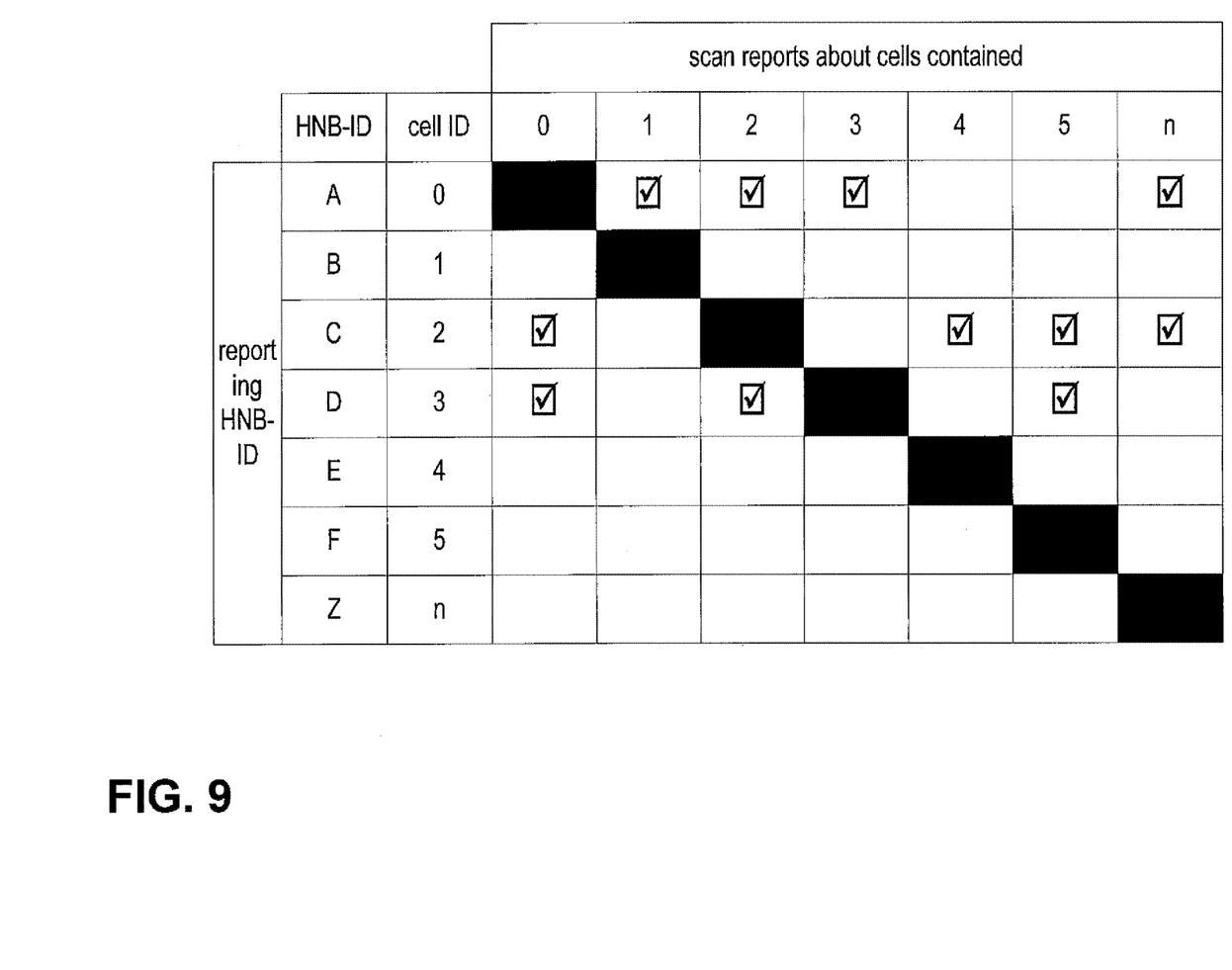
FIG. 9 is a schematic block diagram of a neighbour list derived by a method according to an embodiment of the invention.

Exemplarily the three HNBs HNB1, HNB2 and HNB3 can be considered, along with the information each one reports to the HNB-GW GW 10 during registration in a registration request, which is illustrated in Figure . . . . It can be seen from FIG. 8 that every HNB HNB1, HNB2 and HNB3 provides a set of information to the network, including PLMN-ID, Cell-ID, LAC, RAC, SAC, CSG-ID and Access Mode. The arrows on the right hand side of FIG. 8 show the relations the HNB-GW 10 would derive based on this registration information. It should be noted that a HNB performs the radio scan at minimum during start-up, as performing the scan while in operation would require the transmitter T1 of the HNB to be switched off. Therefore, after having received these three registration requests from the HNB, the HNB-GW 10 is able to visualize the neighbour relations per HNB in the network in a neighbour list. An example of a neighbour list for the HNBs as derived by the HNB-GW 10 is set out as a table as shown in FIG. 9.

In an advantageous embodiment, which is applicable to the case where the wireless communications network is a UTRAN network, the HNB HNB1 requests the UE 1 attached to it, to perform a "Detected Set Reporting" (DSR) measurement for detecting available cells. The UE1 receives the request at the receiver R3, detects and measures available cells using the detector 12 and sends a measurement report to the HNB HNB1 from the transmitter T3. The HNB HNB1 receives a measurement report from the UE1 at the receiver R1 and the comparator C compares the result of the measurement with the currently known neighbouring cell list stored in the database D. In case the measurement report UE1 reveals a currently unknown neighbour not contained on the known list, the HNB 1 then reports the detected new neighbour cell to the HNB-GW 10 using an appropriate message sent from the transmitter T1, which can be newly defined. The HNB-GW 10 incorporates this newly reported neighbouring HNB onto the neighbour list and informs the concerned neighbouring HNBs HNB1, HNB2 and HNB3 accordingly by updating the neighbour list to them.

In a further development of the embodiment described above, the existing neighbour cell handling infrastructure (RRM software) within a HNB HNB1, HNB2, HNB3 is used to gain information as to which cells are located in the neighbourhood of the HNB HNB1, HNB2, HNB3.

It is assumed that each connected HNB HNB1, HNB2, HNB3 is able to exchange relevant information about its working status to the remote operation and maintenance centre (O&M), which includes the HMS and the HNB-GW 10. The details of the information exchange are specific to each Mobile Network Operator. Information which is provided by the O&M in the provisioning and configuration stage is described in 3GPP 25.467 v9.2.0 section 6.1 and includes a list of neighbouring cells relevant for mobility decisions (such as handovers and measurements) acquired during the initial Network Listening Mode (NLM) and consisting of overlaying macro-cells and other HNBs in the nearest vicinity. A list of Primary Scrambling Codes (PSCs) representing the cells is also included. This can be taken from the CSG PSC Split information, which this cell as a hybrid or closed cell is aware of, since it has to broad cast this information to the UE 1.

Figure 10:
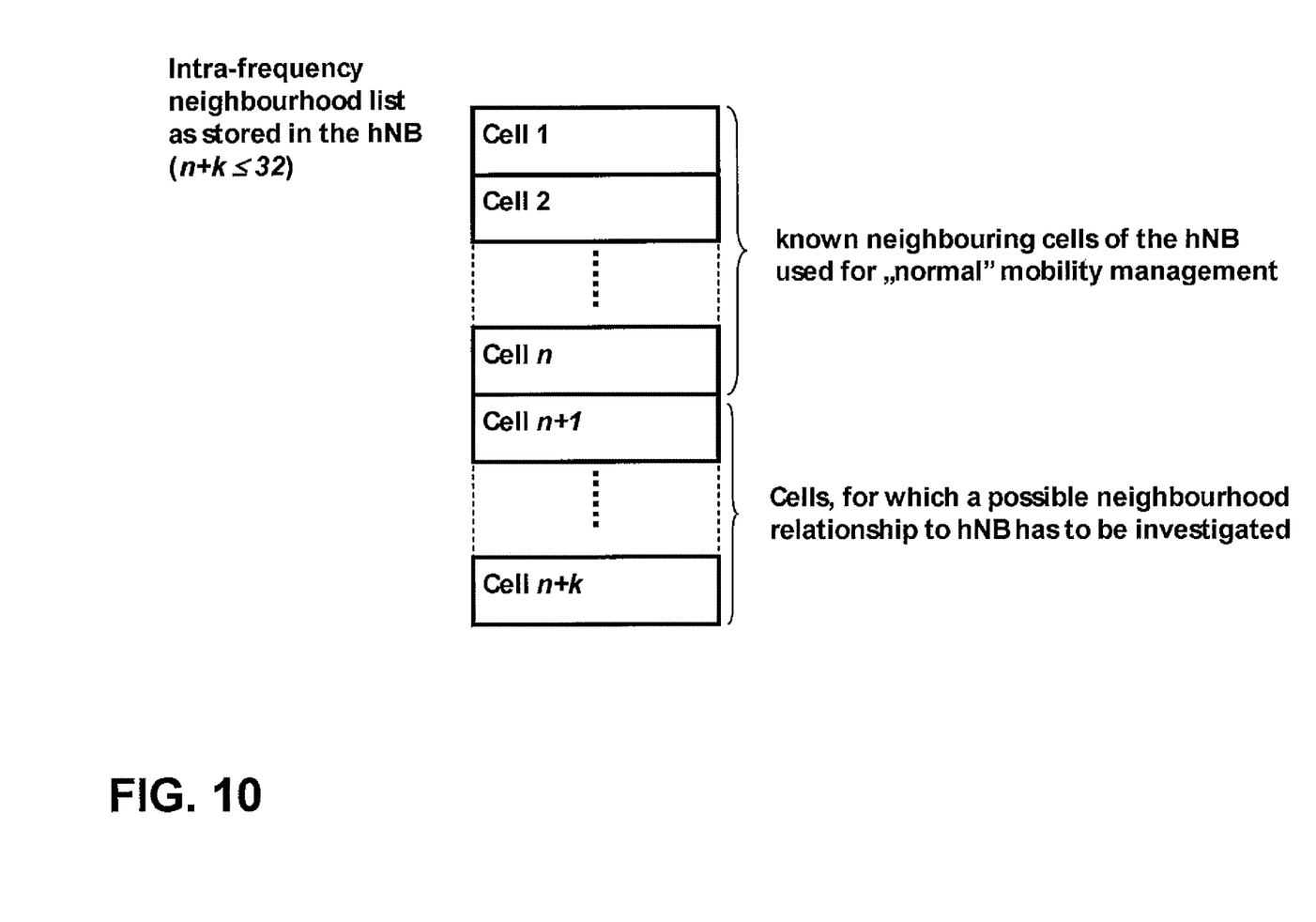
FIG. 10 is an exemplary list of cells stored in an access node.

Therefore, each HNB HNB1, HNB2, HNB3 has the following list of cells as illustrated in FIG. 10:

Cells n+1 to n+k include a PSC coming from the PSC CSG split range but excluding any PSC that has been already discovered during the NLM. This is due to the fact that the initial radio environment scan guarantees no PSC confusion of cells in direct neighbourhood. This narrows down the number of potential neighbouring PSCs (for cells n+1 to n+k).

Figure 11:
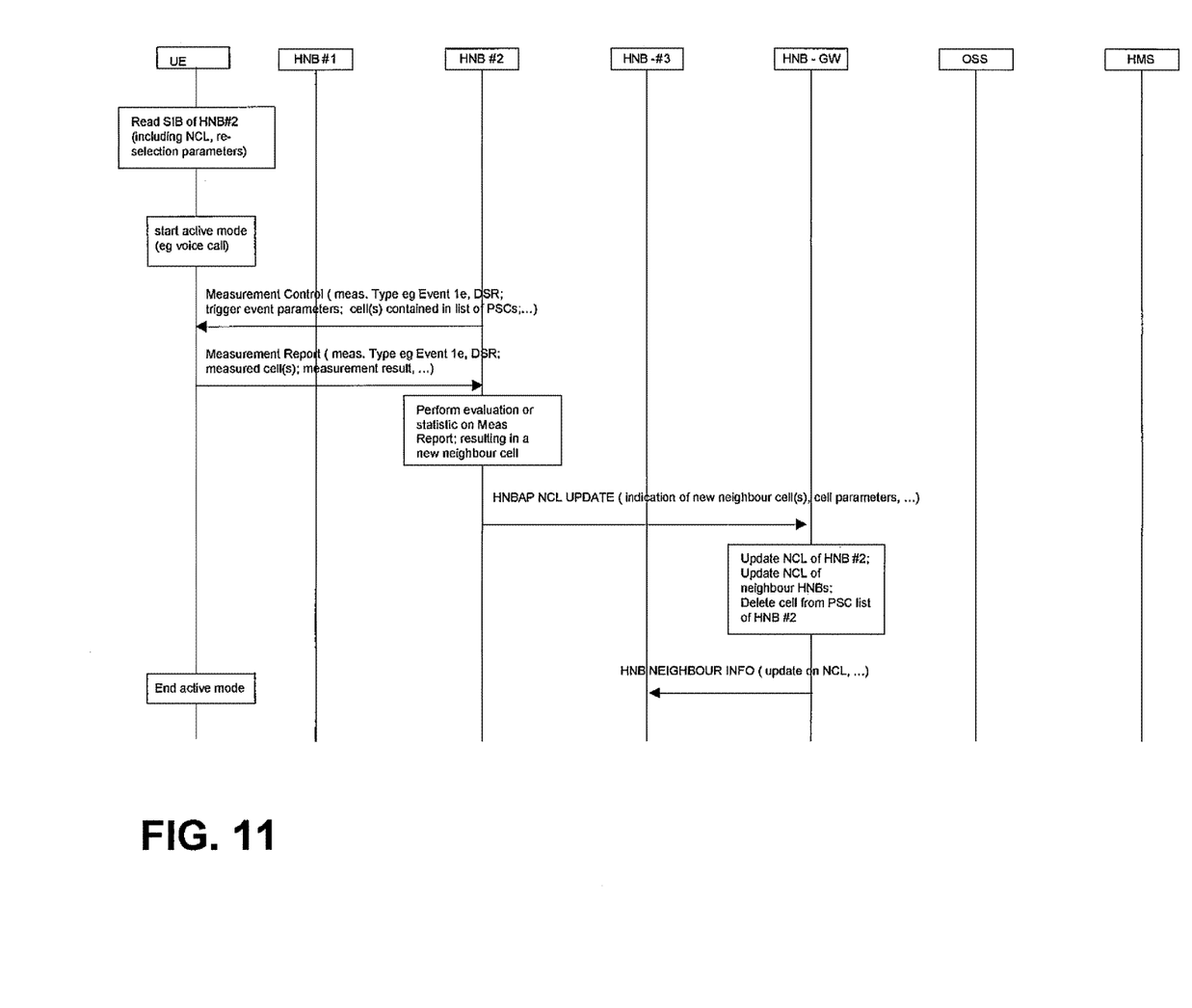
FIG. 11 is an exemplary message flow diagram used in a method according to an embodiment of the invention.

An exemplary message flow for this embodiment is shown in FIG. 11. If the UE 1 is in CELL_DCH state, the HNB HNB1, HNB2, or HNB3 configures the UE 1 to report the measurement event 1E for cells n+1 to cell n+k. Measurement event 1E is an existing intra-frequency measurement, and specified in 3GPP TS 25.331. If the UE 1 is able to detect one or several available cells n+1 to n+k, and if the P-CPICH of one of these cells exceeds the absolute threshold as set in 1E, then the UE 1 is triggered to send a measurement report 1E to the HNB HNB1, HNB2, HNB3. The measurement report includes information about whether a detected available cell is a new neighbour cell.

The HNB HNB1, HNB2, HNB3 stores the information that this cell was detected and reports to the HNB-GW 10, by using an information element added to the HNBAP protocol, that the detected cell is a new neighbour cell. When multiple UEs perform measurement over a time period, information can be collected as to how frequently neighbouring cells were detected.

This provides a much faster way of measuring neighbouring cells and uses a limited number of scrambling codes.

Although the invention has been described hereinabove with reference to specific embodiments, it is not limited to these embodiments and no doubt further alternatives will occur to the skilled person, which lie within the scope of the invention as claimed.

For example, the invention has been described with reference to a UTRAN network. However, it could apply equally to an LTE network, in which case the HNB and HNB-GW 10 would be replace with H(e)NB and H(e)NB-GW, respectively.

For the purpose of the present invention as described herein above, it should be noted that:

- an access technology via which signaling is transferred to and from a network element or node may be any technology by means of which a node can access an access network (e.g. via a base station or (e)Node B or generally an access node). Any present or future technology, such as GSM, UTRAN, LTE, WLAN (Wireless Local Access Network), WiMAX (Worldwide Interoperability for Microwave Access), BlueTooth, Infrared, and the like may be used; although the above technologies are mostly wireless access technologies, e.g. in different radio spectra, access technology in the sense of the present invention implies also wirebound technologies, e.g. IP based access technologies like cable networks or fixed lines but also circuit switched access technologies; access technologies may be distinguishable in at least two categories or access domains such as packet switched and circuit switched, but the existence of more than two access domains does not impede the invention being applied thereto,
- usable access networks may be any device, apparatus, unit or means by which a station, entity or other user equipment may connect to and/or utilize services offered by the access network; such services include, among others, data and/or (audio-) visual communication, data download etc.;
- a user equipment may be any device, apparatus, unit or means by which a system user or subscriber may experience services from an access network, such as a mobile phone, personal digital assistant PDA, or computer;
- method steps likely to be implemented as software code portions and being run using a processor at a network element or terminal (as examples of devices, apparatuses and/or modules thereof, or as examples of entities including apparatuses and/or modules therefor), are software code independent and can be specified using any known or future developed programming language as long as the functionality defined by the method steps is preserved;
- generally, any method step is suitable to be implemented as software or by hardware without changing the idea of the invention in terms of the functionality implemented;
- method steps and/or devices, apparatuses, units or means likely to be implemented as hardware components at a terminal or network element, or any module(s) thereof, are hardware independent and can be implemented using any known or future developed hardware technology or any hybrids of these, such as MOS (Metal Oxide Semiconductor), CMOS (Complementary MOS), BiMOS (Bipolar MOS), BiCMOS (Bipolar CMOS), ECL (Emitter Coupled Logic), TTL (Transistor-Transistor Logic), etc., using for example ASIC (Application Specific IC (Integrated Circuit)) components, FPGA (Field-programmable Gate Arrays) components, CPLD (Complex Programmable Logic Device) components or DSP (Digital Signal Processor) components; in addition, any method steps and/or devices, units or means likely to be implemented as software components may for example be based on any security architecture capable e.g. of authentication, authorization, keying and/or traffic protection;
- devices, apparatuses, units or means can be implemented as individual devices, apparatuses, units or means, but this does not exclude that they are implemented in a distributed fashion throughout the system, as long as the functionality of the device, apparatus, unit or means is preserved,
- an apparatus may be represented by a semiconductor chip, a chipset, or a (hardware) module comprising such chip or chipset; this, however, does not exclude the possibility that a functionality of an apparatus or module, instead of being hardware implemented, be implemented as software in a (software) module such as a computer program or a computer program product comprising executable software code portions for execution/being run on a processor;
- a device may be regarded as an apparatus or as an assembly of more than one apparatus, whether functionally in cooperation with each other or functionally independently of each other but in a same device housing, for example.

LIST OF ABBREVIATIONS

ACS Auto Configuration Server
ANR Automatic Neighbourhood Relation
CN Core Network
CPICH Common Pilot Channel
DSR Detected Set Reporting
H(e)NB Home Evolved Node B
HMS Home Node B Management System
HNB Home Node B
HNBAP Home Node B Application Part
HNB-GW Home NodeB Gateway
HO Hand-over
IE Information Element
IP Internet Protocol
LTE Long Term Evolution
MNO Mobile Network Operator
NCL Neighbouring Cell List
PSC Primary Scrambling Code
O&M Operation and Maintenance
UE User Equipment
UTRAN Universal Terrestrial Radio Access Network
RRM Radio Resource Management
RNC Radio Network Controller
RSSI Received Signal Strength Indicator

The invention claimed is:

1. A method comprising:
registering an access node of a plurality of access nodes with a control node of a wireless communications network;
detecting at the access node other access nodes of said plurality in the network;
reporting information to the control node about the access node, said information including identification of other access nodes of said plurality detected by said access node; and
receiving a neighbour list from the control node containing a list of access nodes which are neighbouring access nodes based on said information; this step further comprises receiving an update of the list of access nodes which are neighbouring access nodes; sending a request to a subscriber station accessing the network to perform a measurement to detect an available cell in the network; receiving the measurement of the detected available cell from the subscriber station; comparing access nodes of the detected available cells with the neighbour list received from the control node; and reporting the detected available cell if it does not have an access node contained in the neighbour list.

2. The method according to claim 1, wherein the detected available cell is triggered to be reported by the subscriber station to the access node if the measurement includes a cell parameter exceeding a predetermined threshold.

3. The method according to claim 2, further comprising informing the control node that the detected available cell is a new neighbour cell.

4. An apparatus comprising:
one or more processors; one or more transmitters; one or more receivers; and
one or more memories including computer program code, the one or more memories and the computer program code configured, with the one or more processors, to cause the apparatus to perform:
registering with a control node of a wireless communications network;
detecting access nodes of a plurality of access nodes in the network;
reporting information, said information including identification of access nodes of said plurality detected by said apparatus, to the control node controlling the apparatus;
receiving a neighbour list from the control node containing a list of access nodes which are neighbouring access nodes based on said information;
receiving from the control node an update of the list of access nodes which are neighbouring access nodes;
sending a request to a subscriber station accessing the network to perform a measurement to detect an available cell in the network;
receiving the measurement of the detected available cell from the subscriber station;
comparing access nodes of the detected available cells with the neighbour list received from the control node; and
reporting to the control node the detected available cell not having an access node contained in the neighbour list.

5. The apparatus according to claim 4, wherein the transmitter is configured to send said request to the subscriber station when a cell parameter exceeds a predetermined threshold.

6. A computer program product comprising a non-transitory computer-readable storage medium bearing computer program code embodied therein for use with a computer, the computer program code comprising code for performing:
registering an access node of a plurality of access nodes with a control node of a wireless communications network;
detecting at the access node other access nodes of said plurality in the network;
reporting information to the control node about the access node, said information including identification of other access nodes of said plurality detected by said access node;
receiving a neighbour list from the control node containing a list of access nodes which are neighbouring access nodes based on said information;
receiving from the control node an update of the list of access nodes which are neighbouring access nodes;
sending a request to a subscriber station accessing the network to perform a measurement to detect an available cell in the network;
receiving the measurement of the detected available cell from the subscriber station;
comparing access nodes of the detected available cells with the neighbour list received from the control node; and
reporting to the control node the detected available cell not having an access node contained in the neighbour list.

* * * * *